United States Patent [19]

Nakagawa et al.

[11] 4,430,387

[45] Feb. 7, 1984

[54] BASE PLATE FOR MAGNETIC RECORDING DISC

[75] Inventors: Nobuo Nakagawa, Yokohama; Yoshiki Kato, Tokyo; Katsuo Abe, Yokosuka; Takao Edamura; Takao Nakamura, both of Yokohama, all of Japan

[73] Assignee: Hitachi, Ltd., Tokyo, Japan

[21] Appl. No.: 206,175

[22] Filed: Nov. 12, 1980

[30] Foreign Application Priority Data

Nov. 14, 1979 [JP] Japan .................. 54-146572

[51] Int. Cl.³ .............................................. B21C 1/00
[52] U.S. Cl. .................. 428/579; 204/38 A; 204/42; 427/131; 360/135; 428/64; 428/65; 428/216; 428/409; 428/411; 428/412; 428/425.8; 428/469; 428/629; 428/636; 428/654; 428/651; 428/653; 428/656; 428/660
[58] Field of Search ............ 428/64, 65, 409, 471, 428/472, 579, 629, 636, 654, 653, 651, 216, 412, 411, 469, 425.8, 660, 656, ; 427/131, 132; 204/38 A, 42; 360/135

[56] References Cited

U.S. PATENT DOCUMENTS

| | | | |
|---|---|---|---|
| 3,808,109 | 4/1974 | Schaurer | 204/38 A |
| 3,886,052 | 5/1975 | Smith | 204/38 A |
| 4,069,360 | 1/1978 | Yanigasuma et al. | 428/65 |
| 4,077,051 | 2/1978 | Vossen, Jr. | 428/64 |
| 4,097,650 | 6/1978 | Shirahata et al. | 428/409 |
| 4,152,487 | 5/1979 | Yanagisawa | 360/135 |
| 4,254,189 | 3/1981 | Fisher | 428/656 |
| 4,356,066 | 10/1982 | Kienle et al. | 428/64 |
| 4,357,366 | 11/1982 | Takaoka et al. | 428/469 |
| 4,364,995 | 12/1982 | Crawford et al. | 428/472 |

FOREIGN PATENT DOCUMENTS

| | | | |
|---|---|---|---|
| 48-28339 | 4/1973 | Japan | 204/38 A |
| 55-12193 | 3/1980 | Japan | 204/38 A |
| 1439869 | 6/1976 | United Kingdom | 427/132 |

OTHER PUBLICATIONS

Mohr et al., Insulating Aluminum Oxide Films, IBM Technical Disclosure Bulletin, vol. 6, No. 3, 8/1963, p. 9.

Primary Examiner—William R. Dixon, Jr.
Attorney, Agent, or Firm—Antonelli, Terry & Wands

[57] ABSTRACT

A base plate for magnetic recording disc is produced by coating thin metal layers containing no impurities for forming defects by an anodizing treatment on one or both sides of a discoid substrate made of a metal such as aluminum or an aluminum alloy or from a plastic by a dry process, and anodizing the thin metal layers so as to form anodized film from the surfaces of the thin metal layers to a certain depth while the portions contacting to the substrate are retained not anodized.

14 Claims, 1 Drawing Figure

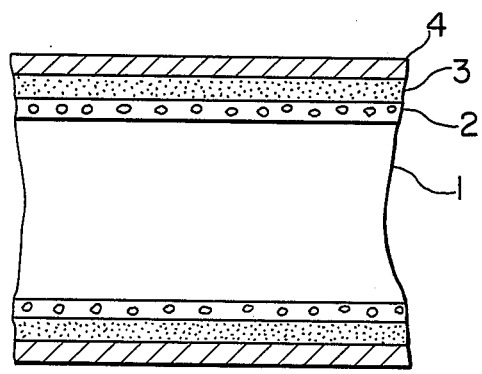

BASE PLATE FOR MAGNETIC RECORDING DISC

BACKGROUND OF THE INVENTION

1. Field of the Invention

This invention relates to a base plate for magnetic recording disc having no defect.

2. Description of the Prior Art

Heretofore, as base plates for magnetic discs with sputtered recording media, there have been used those produced by anodizing treatment on surfaces of aluminum alloy substrate because of its light-weight, followed by abrasion or polishing. The anodized film is formed for improving abrasion workability by increasing hardness of the surfaces of the aluminum substrate and for preventing diffusion or chemical reaction between the aluminum alloy substrate and magnetic recording media such as iron oxide formed on the substrate. But the base plates for magnetic discs produced by the above-mentioned process have disadvantages in that in the case of using an aluminum alloy as a substrate, since intermetallic compounds are produced from trace amounts of iron, manganese, silicon, etc., included in the aluminum alloy substrate so as to be precipitated on crystal grain boundaries or in crystal grains, pin holes having a diameter of 3 $\mu$m or more are produced on the portions where the intermetallic compounds are precipitated on the anodized film. For example, when the aluminum alloy substrate contains iron in an amount of at least 0.005% by weight, intermetallic compounds are precipitated to form defects on the anodized film. In order to remove such a disadvantage, it is thinkable to reduce the amounts of impurities in the substrate, but such a thing can hardly be attained practically, and even if the impurity amounts can be reduced to such an extent, the cost of substrate becomes disadvantageously expensive.

Another method proposed for reducing the number of pin holes on the anodized film is to form layers of pure aluminum and the like on the surfaces of the substrate by a rolling process, or a cladding process. But according to this cladding process, there is another disadvantage in that impurities are transferred to the cladding layer from rolling rollers and a lubricant at the time of rolling and many defects are formed on an anodized film formed on the cladding layer. Further, there is proposed a process for adhering a plastic to the substrate mentioned above by using an adhesive or by contact bonding with heating. But such a process has a disadvantage in that the bonding layer is not even. According to a process wherein the above-mentioned substrate is formed by molding a plastic, strain is produced in the molded portions and cracks are produced unfavorably during the use.

On the other hand, there is proposed a process wherein pin holes on the anodized film are filled with a thermosetting resin, followed by polish finish, but the number of pin holes cannot be reduced remarkably according to this process.

Further, according to a process wherein a base plate for magnetic recording disc is produced by forming a film of oxide such as $SiO_2$, $Ta_2O_5$, $Al_2O_3$ or the like by a sputtering process or the like directly on an aluminum alloy substrate, adhesiveness of the oxide film to the substrate is unfavorably not good.

SUMMARY OF THE INVENTION

It is an object of this invention to provide a base plate for magnetic recording disc overcoming the disadvantages of conventional techniques mentioned above, having almost no pin holes and produced with low cost.

The above-mentioned object can be attained by using a material which hardly produces defects such as pin holes on the anodized film after anodizing treatment as the base plate for magnetic recording disc. That is, this invention provides a base plate for magnetic recording disc produced by forming a thin metal film which is readily anodized, e.g. a pure aluminum film, an aluminum alloy film (containing no element such as iron, manganese, silicon, or the like which forms defect portions such as pin holes on the anodized film), a titanium film, a magnesium film, a magnesium alloy film, a tantalum film, a niobium film or the like on one or both sides of a substrate by a dry process such as a vacuum evaporation process, a sputtering process, an ion plating process, or the like, anodizing the thus formed film to form an anodized film having almost no pin holes thereon to a certain depth from the surface thereof, and polishing the anodized film.

The thin metal film which is readily anodized and contains no element such as iron, manganese, silicon, or the like can hardly be formed by an ordinary plating process and can only be formed by a dry process.

BRIEF DESCRIPTION OF THE DRAWING

The attached drawing is a cross-sectional view of a magnetic recording disc.

DETAILED DESCRIPTION OF THE PREFERRED EMBODIMENT

Since the base plate for magnetic recording disc of this invention has remarkably smaller number of or almost no defect portions such as pin holes, magnetic recording discs produced by using such a base plate have features (a) to (c) mentioned below:

(a) A conventional magnetic recording disc has defects of 3 $\mu$m or more in diameter in an amount of 200/single side, whereas a magnetic recording disc produced by using the base plate of this invention has defects in an amount of 3/single side or less (hereinafter defined as "no defect").

(b) A conventional magnetic recording disc uses a very expensive base plate containing impurities in very small amounts, whereas a magnetic recording disc produced by using the base plate of this invention can use a non-expensive material containing impurities as base plate if it is good in light-weight, strength and processability.

(c) Since the surface of a thin film layer formed by a dry process is very clean, an anodized film having no defect can be obtained by a direct anodizing treatment and a pretreatment of anodic oxidation can be omitted. This leads to not only the reduction of production cost but also reduction of defects because of omission of the pretreatment which has many problems in process control.

Among them, the effect of the above-mentioned feature (a) is very great, so that the yield of magnetic recording discs is greatly improved, and further since recording and reproducing errors are reduced, the quality as the disc apparatus is improved and the cost necessary for error relief circuits is greatly reduced. Totalling these effects, merits of this invention on the production of magnetic recording discs are by far great.

The formation of thin metal film which is readily anodized on the substrate by a dry process such as a vacuum evaporation process, a sputtering process or an ion plating process and the successive anodizing treatment of the metal film can be conducted by the processes (1) to (3) mentioned below.

(1) Formation of thin metal film on a substrate by the vacuum evaporation process.

A base plate for magnetic recording disc can be obtained by the treatments (a) to (g) in this order.

(a) Polishing of substrate surfaces: Until 0.012 μm Ra to 0.03 μm Ra.

(b) Degreasing (in the case of Al): A substrate is immersed in trichloroethylene at 15° C. to 35° C. for 3 to 10 minutes. When ultrasonic vibration is given at that time, the degreasing can be carried out more effectively. Subsequently, the substrate is immersed in an aqueous alkaline solution containing NaOH 30 g/l. to 70 g/l., sodium gluconate 4 g/l. to 6 g/l. and water, a total being 1 liter, at 40° C. to 60° C. with heating for 1 to 10 minutes.

(c) Water washing: The substrate is washed with deionized water.

(d) Drying: Spin drying.

(e) Vacuum evaporation (in the case of Al):
Pressure: $1 \times 10^{-6}$ Torr or less
Vapor source: Al having a purity of 99.999% or more
Substrate temperature: 150° C. to 300° C.
Film forming rate: 3000 Å/min to 15000 Å/min
Film thickness: 3 μm to 10 μm In place of the aluminum, there can be deposited an aluminum alloy (Al 90.0% by weight to 99.9% by weight, Mg 10.0% by weight to 0.1% by weight), titanium, magnesium, a magnesium alloy (Mg 90.0% by weight to 99.9% by weight, Al 10.0% by weight to 0.1% by weight), tantalum, or niobium.

(f) Anodizing treatment (in the case of Al film or Al-Mg alloy film)
Solution: 5%–20% $H_2SO_4$
Temperature: 10° C. to 30° C.
Anodizing current density: 0.5 A/dm$^2$ to 5 A/dm$^2$
Time: 5 min. to 30 min.

(g) Polishing of anodized film: Until 0.012 μm Ra to 0.03 μm Ra
Abrasives: Diamond powders, 0.05±0.01 μm,
Polishing fluid: Mechanochemical polishing fluid
Polishing time: 5 min. to 10 min.

(2) Formation of thin metal film on a substrate by the sputtering process.

Polishing of substrate surfaces, degreasing, water washing and drying are conducted in the same manner as described in (1) (a) to (d). Subsequently, the procedures (h) and (i) mentioned below are conducted, followed by the same treatments (1) (f) and (g) mentioned above.

(h) Sputter-etching (this can be omitted in the case of Al or Al-Mg alloy)
Atmosphere and pressure: Ar, $2 \times 10^{-2}$ Torr to $8 \times 10^{-3}$ Torr
Etching amount: 200 Å to 700 Å
Sputtering power: 0.1 W/cm$^2$ to 3 W/cm$^2$ (DC mood)

(i) Sputtering (in the case of Al or Al-Mg alloy)
Target: Al or Mg having a purity of 99.999% or more
Atmosphere and pressure: Ar, $4 \times 10^{-3}$ Torr
Ultimate pressure: $1 \times 10^{-6}$ Torr or less
Sputtering method: DC mood, diode type or planar magnetron type
Film forming rate: 5000 Å/min or more
Film thickness: 3 μm to 10 μm In place of aluminum, there may be used an aluminum alloy, Ti, Mg, a Mg alloy, Ta, or Nb for sputtering. In the case of using Mg for sputtering, there can be used sputtering conditions and anodizing treatment conditions mentioned hereinafter.

(3) Formation of thin metal film on a substrate by the ion plating process.

Polishing of substrate surfaces, degreasing, water washing and drying are conducted in the same manner as described in (1) (a) to (d). Subsequently, the procedure (j) mentioned below is conducted, followed by the same treatments (1) (f) and (g) mentioned above.

(j) Ion plating (in the case of Al)
Vapor source: Al having a purity of 99.999% or more
Heating method: electron beam type, 1 kW to 10 kW
Atmosphere and pressure: Ar, $5 \times 10^{-3}$ Torr to $1 \times 10^{-2}$ Torr
Ultimate pressure: $1 \times 10^{-4}$ Torr or less
Film forming rate: 15000 Å/min to 4000 Å/min
Film thickness: 3 μm to 10 μm
Bias voltage (base plate): $-0.5$ kV to $-3$ kV
Substrate holder temperature: 50° C. to 300° C.

Materials used in this invention are as follows.

As the substrate for the base plate for magnetic recording disc, there can be used (a) aluminum alloys such as Al-Cu (3.5–5.0% by weight) alloy, Al-Mn (1.0–1.5% by weight) alloy, Al-Mg (0.8–1.2% by weight) alloy (corresponding to a specification material of ASTM 5086), Al-Mg (0.8–1.2% by weight)—Cu (0.15–0.40% by weight) alloy, Al-Zn (5–6% by weight) alloy, Al-Zn (5–6% by weight)—Cu (1.2–2.0% by weight) alloy, and the like, (b) magnesium alloys such as Mg-Al (2.4–3.6% by weight)—Zn (0.5–1.5% by weight) alloy, and the like, (c) titanium, (d) iron plates (corresponding to specification materials of ASTM 570-75 an ASTM A10-9—72), (e) plastics such as polycarbonates (preferably those having a heat distortion temperature of 120° C. or higher), polyurethanes (preferably those having a heat distortion temperature of 120° C. or higher), polyethers preferably having a heat distortion temperature of 120° C. or higher (preferably chlorinated polyethers), and the like. When these plastics contain 30% by weight or less of glass fibers, their heat distortion temperatures increase advantageously. In addition, one of these materials (a) to (e) mentioned above coated with metal or metals which cannot be anodized by an ordinary plating can also be used as the substrate.

As the vapor source or the target, there can be used (a) aluminum having a purity of 99.999% or higher, (b) magnesium having a purity of 99.999% or higher, (c) titanium having a purity of 99.999% or higher, (d) tantalum having a purity of 99.999% or higher, (e) niobium having a purity of 99.999% or higher, (f) an aluminum alloy (Al having a purity of 99.999% or higher in an amount of 90.0 to 99.9% by weight and Mg having a purity of 99.999% or higher in an amount of 10.0 to 0.1% by weight), (g) a magnesium alloy (Mg having a purity of 99.999% or higher in an amount of 90.0 to 99.9% by weight and Al having a purity of 99.999% or higher in an amount of 10.0 to 0.1% by weight), and the like.

This invention is illustrated by way of the following Examples.

EXAMPLE 1

As a substrate 1 shown in the attached drawing, there was used an aluminum alloy plate corresponding to ASTM 5086 having an outer diameter of 356 mm and inner diameter of 168 mm with 2 mm thick, the surfaces of which were latched with diamond cutting tool to surface roughness of 0.03 $\mu$m Ra. The substrate was subjected to trichloroethylene degreasing, alkali degreasing, water washing and drying under the following conditions (a) to (d).

(a) Trichloroethylene degreasing

The substrate was immersed in trichloroethylene at 25° C. for 5 minutes with ultrasonic vibration.

(b) Alkali degreasing

The substrate was subjected to alkali degreasing under the following conditions:

Composition of a solution:
NaOH: 50 g/l.
Sodium gluconate: 5 g/l.
Water: A sufficient amount to make the solution 1 liter.

Degreasing conditions:
The substrate was immersed in the above-mentioned degreasing solution at 55° C. for 3 minutes.

(c) Water washing
The substrate was washed with deionized water.

(d) Drying
The substrate was dried by spin drying (3600 r.p.m.)

Subsequently, the substrate was set in a vacuum evaporation chamber and aluminum was evaporated on the substrate to the thickness of 7.5 $\mu$m under the conditions as mentioned in (e) below to give thin metal films 2 shown in the attached drawing.

(e) Vacuum evaporation of aluminum
Ultimate pressure: $5 \times 10^{-7}$ Torr
Vapor source: Al having a purity of 99.999%
Substrate temperature: 200° C.
Deposition speed: 4000 Å/min Subsequently, the substrate evaporated with aluminum was taken out of the chamber and immediately subjected to anodizing treatment under the conditions described in (f) below to give anozided film 3 having a thickness of 5 $\mu$m with no pin hole as shown in the attached drawing.

(f) Anodizing treatment
Solution: 10% $H_2SO_4$
Temperature: 10° C.
Current density: 3 A/dm$^2$ (anodic)
Time: 5 minutes In this case, the vacuum evaporated aluminum film was retained unchanged in 2.5 $\mu$m thick. The thus obtained anodized substrate was polished under the conditions described in (i) below to give surface roughness of 0.015 $\mu$m Ra.

(i) Finishing process
Abrasives: Diamond powders, 0.05 $\mu$m
Polishing fluid: Mechanochemical polishing fluid The base plate for magnetic recording disc was washed with water and dried under the conditions (c) and (d) as mentioned above, and then subjected to degreasing and cleaning treatment under the conditions (ii) and (iii) mentioned below:

(ii) Degreasing
Solvent: $CCl_3CF_3$
Treating conditions: Allowed to stand in the solvent vapor for 3 minutes.

(iii) Cleaning treatment
The base plate was rotated at a speed of 3600 r.p.m. and cleaned by spraying 100 ml of $CCl_3CF_3$ while rotating.

Then, the base plate was set in a sputtering chamber and recording media 4 as shown in the attached drawing made of iron oxide having a thickness of 0.2 $\mu$m was formed under the conditions (iv) mentioned below:

(iv) Formation of recording medium
Target: Iron having a purity of 99.9% or iron alloy (Fe 98.0% by weight and Co 2.0% by weight)
Atmosphere and pressure: A mixed gas of Ar 95% by volume and $O_2$ 5% by volume, $6 \times 10^{-3}$ Torr
Base plate temperature: 200° C.
Sputtering power: 2.5 W/cm$^2$ (RF mood)

Thereafter, the resulting magnetic disc was treated at 300° C. for 2 hours in order to improve magnetic properties of the recording media and the magnetic recording disc having no defect was obtained.

EXAMPLE 2

A disc made from a polycarbonate resin (Iupilon GS2030, manufactured by Mitsubishi Gas-Chemical Co., Inc.) and having an outer diameter of 356 mm and inner diameter of 168 mm with 4 mm thick was heated at 150° C. for 24 hours for removing strain and both surfaces of the disc was polished by using diamond powders having a particle size of 0.03 $\mu$m, and OS oil manufactured by Hyprez Co. as a polishing fluid with 3 kg of load and rotation speed of 30 r.p.m. to give surface roughness of 0.03 $\mu$m Ra. The polished disc was used as a substrate 1 as shown in the attached drawing. Subsequently, the substrate was subjected to degreasing, washing with water and drying in the same manner as described in Example 1 (a) to (d). Then the substrate was set in a sputter-etching chamber for improving adhesiveness in an atmosphere of Ar under a pressure of $8 \times 10^{-3}$ Torr with sputtering power of DC 0.3 W/cm$^2$ for etching the surfaces of the polycarbonate resin in 500 Å thick. Then the substrate was subjected to sputtering of aluminum under the following conditions to give thin aluminum films 2 in the attached drawing having a thickness of 10 $\mu$m.

Sputtering conditions:
Target: Al having a purity of 99.999%
Atmosphere and pressure: Ar, $5 \times 10^{-3}$ Torr
Ultimate pressure: $6 \times 10^{-7}$ Torr
Sputtering method: DC mood, diode type
Film forming rate: 5000 Å/min Subsequently, anodizing treatment was conducted in the same manner as mentioned in Example 1 (f) to give anodized film 3 shown in the attached drawing having a thickness of 5 $\mu$m. A base plate for magnetic recording disc was obtained by subjecting the resulting substrate to the same finishing process, degreasing and cleaning treatment as described in Example 1 (i) to (iii). The base plate was subjected to degreasing and cleaning treatment in the same manner as described in Example 1 (c) and (d), followed by sputtering as described in Example 1 (iv) to give recording media 4 as shown in the attached drawing made of iron oxide and having a thickness of 0.2 $\mu$m. After heat treating at 200° C. for 2 hours for improving magnetic properties, there was obtained a magnetic recording disc having no defect.

EXAMPLE 3

As a substrate 1 shown in the attached drawing, there was used an aluminum alloy plate corresponding to ASTM 5086 having an outer diameter of 356 mm and inner diameter of 168 mm with 2 mm thick, the surfaces of which were latched with diamond cutting tool to surface roughness of 0.012 μm Ra. The substrate was subjected to trichloroethylene degreasing, alkali degreasing, water washing and drying in the same manner as described in Example 1 (a) to (d). Then the substrate was set in a sputter-etching chamber and heated at 200° C. for improving surface cleaning and adhesiveness, and sputter-etching was conducted by DC mood, in an atmospheric gas of Ar under a pressure of $7 \times 10^{-3}$ Torr for 20 minutes to give an etching amount of 200 Å/min. Then the substrate was subjected to sputtering of aluminum under the following conditions to give a thin aluminum film 2 in the attached drawing having a thickness of 7.5 μm.

Sputtering conditions:
Target: Al having a purity of 99.999%
Atmosphere and pressure: Ar, $4 \times 10^{-3}$ Torr
Ultimate pressure: $6 \times 10^{-7}$ Torr
Sputtering method: DC mood, planar magnetron type
Film forming rate: 6000 Å/min Subsequently, anodized film 3 and recording media 4 as shown in the attached drawing were formed in the same manner as described in Example 1 and a magnetic recording disc having no defect was produced by heat treatment in the same manner as described in Example 1.

EXAMPLE 4

When an Al-Mg alloy containing Al having a purity of 99.999% in an amount of 98.0% by weight and Mg having a purity of 99.999% in an amount of 2.0% by weight was used as target for sputtering in place of waluminum having a purity of 99.999% used in Examples 1 to 3, the same base plate for magnetic recording disc having anodized film 3 as shown in the attached drawing with no defect and the same magnetic recording disc, as obtained in Examples 1 to 3, were obtained.

EXAMPLE 5

The process of Example 1 was repeated except for conducting sputtering and anodizing treatment under the conditions (i) and (ii) mentioned below to give a base plate for magnetic recording disc having anodized film 3 as shown in the attached drawing with no defect and a magnetic recording disc having no defect produced from said base plate.

(i) Sputtering
Target: Mg having a purity of 99.999%
Atmosphere and pressure: Ar, $5 \times 10^{-3}$ Torr
Ultimate pressure: $1 \times 10^{-6}$ Torr
Sputtering method: DC mood, diode type
Film forming rate: 5000 Å/min
Film thickness: 5 μm (ii) Anodizing treatment

| Solution: | |
|---|---|
| KMnO₄ | 20 g/l. |
| KF | 35 g/l. |
| Potassium phosphate | 35 g/l. |
| KOH | 100 g/l. |
| H₂O | A sufficient amount to make the whole 1 liter |

Anodizing current density:
$D_A = 2$ A/dm,
Solution temperature 20° C.
Thickness of MgO film obtained: 3 μm

EXAMPLE 6

The same substrate 1 as used in Example 3 was used and the surfaces of the substrate was subjected to trichloroethylene degreasing, alkali degreasing, water washing and drying in the same manner as described in Example 1. Subsequently, the substrate was set in an ion plating chamber and thin aluminum layers 2 were formed on the substrate by an ion plating process under the following conditions:

Ion plating conditions:
Vapor source: Al having a purity of 99.999%
Heating method: electron beam type, 3.5 kW
Atmosphere and pressure: Ar, $5 \times 10^{-2}$ Torr
Ultimate pressure: $5 \times 10^{-5}$ Torr
Film forming rate: 15000 Å/min
Film thickness: 5.0 μm
Bias voltage (base plate): −2.0 kV
Substrate holder temperature: 200° C.

Subsequently, anodized film 3 as shown in the attached drawing in 3.0 μm thick were formed in the same manner as described in Example 1, followed by finishing process in the same manner as described in Example 1 to form recording media and a magnetic recording disc having no defect.

EXAMPLE 7

The same substrate 1 as used in Example 1 was used and the surfaces of the substrate were subjected to trichloroethylene degreasing, alkali degreasing, water washing and drying in the same manner as described in Example 1. Subsequently, zinc layers of 0.5 μm thick were formed on the substrate by a zinc substitution treatment and copper plating layers of 4 μm thick were formed on the zinc layers by a copper strike plating method in order to improve adhesiveness, followed by copper-tin alloy plating. Subsequently, metal films which could be readily anodized were formed thereon by vacuum evaporation in the same manner as described in Example 1. The metal films were subjected to anodizing treatment, finishing process, degreasing and cleaning treatment as described in Example 1, and a magnetic recording disc having no defect was produced from the resulting base plate in the same manner as described in Example 1.

What is claimed is:

1. A base plate for a magnetic recording disc comprising a light, durable, smooth-surfaced discoid substrate, a thin metal layer formed on at least one side of the substrate, and an anodized layer formed from the surface of said at least one thin metal layer to a depth of at least one-half of the thickness of the thin metal layer by an anodizing treatment, said at least one thin metal layer containing no element which produces surface pin-hole defect portions on the anodized layer formed by the anodizing treatment and being formed by a dry process using, as a vapor source or a target, (a) aluminum having a purity of at least 99.999%; (b) magnesium having a purity of at least 99.999%; or (c) an aluminum-magnesium alloy in which aluminum has a purity of at least 99.999% in an amount of 90.0 to 99.9% by weight and magnesium has a purity of at least 99.999% in an amount of 10.0 to 0.1% by weight.

2. A base plate for magnetic recording disc according to claim 1, wherein the discoid substrate is made from one material selected from the group consisting of an Al-Cu (3.5 to 5.0% by weight) alloy, an Al-Mn (0.1 to 1.5% by weight) alloy, an Al-Mg (0.8 to 1.2% by weight) alloy, an Al-Mg (0.8 to 1.2% by weight)—Cu (0.15 to 0.40% by weight) alloy, an Al-Zn (5.0 to 6.0% by weight) alloy, an Al-Zn (5.0 to 6.0% by weight)—Cu (1.2 to 2.0% by weight) alloy, a Mg-Al (2.4 to 3.6% by weight)—Zn (0.5 to 1.5% by weight) alloy, Ti, Fe, one of these alloys or metals, the surfaces of which are coated with a metal or metals which cannot be anodized, a polycarbonate, a polyurethane, a polyether, and one of these plastics mentioned above, the surfaces of which are coated with a metal or metals which cannot be anodized.

3. A base plate for magnetic recording disc according to claim 1, wherein the discoid substrate is made of an Al-Mg (0.5 to 5.0% by weight) alloy or from a polycarbonate, the thin metal layer which is readily anodized is formed on the substrate by a vacuum evaporation process using Al having a purity of 99.999% or more as a vapor source under a pressure of $1 \times 10^{-6}$ Torr or less at a temperature of the discoid substrate of 150° C. to 300° C. and a film forming rate of 3000 to 15000 Å/min to a thickness of 3 to 10 $\mu$m, and the anodized thin metal layer is formed in a 5 to 20% $H_2SO_4$ solution at a solution temperature of 10° to 30° C. and an anodizing current density of 0.5 to 5 $A/dm^2$ for 5 to 30 minutes.

4. A base plate for magnetic recording disc according to claim 1, wherein the discoid substrate is made of an Al-Mg (0.5 to 5.0% by weight) alloy or from a polycarbonate, the thin metal layer which is readily anodized is formed on the substrate by a sputtering process by using Al having a purity of 99.999% or more or an Al-Mg alloy in which Al has a purity of at least 99.999% in an amount of 90.0 to 99.9% by weight and Mg has a purity of at least 99.999% or higher in an amount of 10.0 to 0.1% by weight as target in an atmosphere of Ar under a pressure of $4 \times 10^{-3}$ Torr and an ultimate pressure of $1 \times 10^{-6}$ Torr or less with a film forming rate of 5000 Å/min or more by using a DC mood and diode type or planar magnetron type to a thickness of 3 to 10 $\mu$m, and the anodized thin metal layer is formed in a 5 to 20% $H_2SO_4$ solution at a solution temperature of 10° to 30° C. and an anodizing current density of 0.5 to 5 $A/dm^2$ for 5 to 30 minutes.

5. A base plate for magnetic recording disc according to claim 1, wherein the discoid substrate is made of an Al-Mg (0.5 to 5.0% by weight) alloy or from a polycarbonate, the thin metal layer which is readily anodized is formed on the substrate by an ion plating process by using Al having a purity of 99.999% or more as a vapor source and an electron beam type heating source having a power of 1 to 10 kW by introducing Ar under a pressure of $5 \times 10^{-3}$ to $1 \times 10^{-2}$ Torr at a bias voltage of $-0.5$ to $-3$ kV and a substrate holder temperature of 50° to 300° C. with a film forming rate of 15000 to 40000 Å/min to a thickness of 3 to 10 $\mu$m, and the anodized thin metal layer is formed in a 5 to 20% $H_2SO_4$ solution at a solution temperature of 10° to 30° C. and an anodizing current density of 0.5 to 5 $A/dm^2$ for 5 to 30 minutes.

6. A base plate for magnetic recording disc according to claim 1, wherein the dry process is a vacuum evaporation process under a pressure of $1 \times 10^{-6}$ Torr or less at a temperature of the discoid substrate of 150° C. to 300° C. and a film forming rate of 3,000 to 15,000 Å/min to a film thickness of 3 to 10 $\mu$m.

7. A base plate for magnetic recording disc according to claim 1, wherein the dry process is a sputtering process in an atmosphere of Ar under a pressure of $4 \times 10^{-3}$ Torr and an ultimate pressure of no more than $1 \times 10^{-6}$ Torr with a film forming rate of at least 5,000 Å/min to a film thickness of 3 to 10 $\mu$m.

8. A base plate for magnetic recording disc according to claim 1, wherein the dry process is an ion plating process introducing Ar under a pressure of $5 \times 10^{-3}$ to $1 \times 10^{-2}$ Torr at a substrate holder temperature of 50° to 300° C. with a film forming rate of 15,000 to 40,000 Å/min to a film thickness of 3 to 10 $\mu$m.

9. A base plate for magnetic recording disc according to claim 1, wherein the thin metal layer is formed by a vacuum evaporation process using Al having a purity of at least 99.999% or an aluminum alloy in which Al has a purity of at least 99.999% in an amount of 90.0 to 99.9% by weight and Mg has a purity of at least 99.999% in an amount of 10.0 to 0.1% by weight as a vapor source under a pressure of $1 \times 10^{-6}$ Torr or less at a temperature of the discoid substrate of 150° to 300° C. and a film forming rate of 3,000 to 15,000 Å/min to a film thickness of 3 to 10 $\mu$m.

10. A base plate for magnetic recording disc according to claim 1, wherein the thin metal layer is formed by a sputtering process by using Al having a purity of at least 99.999% or an aluminum alloy in which Al has a purity of at least 99.999% in an amount of 90.0 to 99.9% by weight and Mg has a purity of at least 99.999% in an amount of 10.0 to 0.1% by weight as a target in an atmosphere of Ar under a pressure of $4 \times 10^{-3}$ Torr and an ultimate pressure of $1 \times 10^{-6}$ Torr or less with a film forming rate of 5,000 Å/min or more to a film thickness of 3 to 10 $\mu$m.

11. A base plate for magnetic recording disc according to claim 1, wherein the thin metal layer is formed by an ion plating process by using Al having a purity of at least 99.999% or an aluminum alloy in which Al has a purity of at least 99.999% in an amount of 90.0 to 99.9% by weight and Mg has a purity of at least 99.999% in an amount of 10.0 to 0.1% by weight as a vapor source and introducing Ar under a pressure of $5 \times 10^{-3}$ to $1 \times 10^{-2}$ Torr at a substrate holder temperature of 50° to 300° C. with a film forming rate of 15,000 to 40,000 Å/min to a film thickness of 3 to 10 $\mu$m.

12. A base plate for a magnetic recording disc which is produced by coating at least one thin metal layer by a dry process containing no impurities for forming pinhole defects with an anodizing treatment on at least one side of a light, durable, smooth-surfaced discoid substrate, and by anodizing the at least one thin metal layer so as to form anodized film from the surface of the thin metal layer to a depth of at least one-half of the thickness of the thin metal layer being anodized while portions of the at least one metal layer contacting the substrate are retained not anodized, said at least one thin metal layer being produced by using as a vapor source or a target: (a) aluminum having a purity of at least 99.999%; (b) magnesium having a purity of at least 99.999%; or (c) an aluminum-magnesium alloy in which aluminum has a purity of at least 99.999% in an amount of 90.0 to 99.9% by weight and magnesium has a purity of at least 99.999% in an amount of 10.0 to 0.1% by weight.

13. A base plate for magnetic recording disc according to claim 12, wherein the dry process is a vacuum evaporation process, a sputtering process or an ion plating process.

14. A base plate for a magnetic recording disc according to claim 12 or claim 1, wherein the anodized layer is formed to a depth of from 3 to 5 μm within said thin metal layer.

* * * * *